United States Patent
Wagner et al.

(10) Patent No.: US 7,034,316 B2
(45) Date of Patent: Apr. 25, 2006

(54) SAMPLE CARRIER FOR CARRYING A SAMPLE TO BE IRRADIATED WITH AN ELECTRON BEAM

(75) Inventors: Raymond Wagner, Nuenen (NL); Gerbert Jeroen van de Water, Deil (NL)

(73) Assignee: FEI Company, Hillsboro, OR (US)

( * ) Notice: Subject to any disclaimer, the term of this patent is extended or adjusted under 35 U.S.C. 154(b) by 6 days.

(21) Appl. No.: 10/870,617

(22) Filed: Jun. 17, 2004

(65) Prior Publication Data

US 2004/0256570 A1   Dec. 23, 2004

(30) Foreign Application Priority Data

Jun. 20, 2003  (NL)  .................................... 1023717

(51) Int. Cl.
*G01N 1/28* (2006.01)
(52) U.S. Cl. .............. 250/440.11; 250/311; 250/442.11
(58) Field of Classification Search ........... 250/440.11, 250/442.11, 311
See application file for complete search history.

(56) References Cited

U.S. PATENT DOCUMENTS

| 4,242,586 A | 12/1980 | Warble |
| 4,250,127 A | 2/1981 | Warren et al. |
| 6,060,707 A * | 5/2000 | Fujihara ..................... 250/311 |
| 6,576,910 B1 * | 6/2003 | Hashikawa et al. .... 250/442.11 |
| 2004/0100624 A1 * | 5/2004 | Hagiwara et al. ............. 355/72 |

OTHER PUBLICATIONS

Guide to TEM Grid Selection, SPI Supplies and Structure Probe, Inc., (2000) <http://www.2spi.com/catalog/grids/square_mesh_200.shtml>.

* cited by examiner

*Primary Examiner*—Nikita Wells
(74) *Attorney, Agent, or Firm*—Michael O. Scheinberg

(57) ABSTRACT

Sample carriers for use in Transmission Electron Microscopes (TEMs) and freely commercially available have the form of a gauze with a strengthening edge. The thickness of these known sample carriers is of the order of magnitude of 20 µm, and is uniform across the entire sample holder. The tiny thickness of these fragile sample carriers makes manipulation difficult. There is a desire to realize automatic introduction and removal of sample carriers in a TEM, seeing as this would make it possible to use the TEM continuously, without human intervention.

The invention describes a robust sample carrier whereby—both in the case of manual and automatic manipulation—deformation of and/or damage to the sample carrier is avoided. This is achieved by employing a strengthening edge portion 2 with a thickness 6 larger than the thickness 5 of the middle portion 1 of the sample carrier. The ability to use the sample carrier in analyses in which tilting is important is hereby not impeded.

20 Claims, 1 Drawing Sheet

SAMPLE CARRIER FOR CARRYING A SAMPLE TO BE IRRADIATED WITH AN ELECTRON BEAM

TECHNICAL FIELD OF THE INVENTION

The invention relates to a sample carrier for carrying a sample to be irradiated with an electron beam, which sample carrier comprises a middle portion that is at least partially transparent to electrons, and an edge portion—located at the periphery of the middle portion—with a strengthening effect.

BACKGROUND OF THE INVENTION

Such a sample carrier is known from the catalog of the firm Structure Probe, Inc., with an address at 569 East Gay Street, West Chester, PA 19380, USA, under catalog number 2020C-XA, as described on the priority date of the present patent application on the website http://www.2spi.com/catalog/grids/square_mesh_200.shtml. The described embodiment concerns a round copper foil, whereby the circular middle portion is perforated with square openings. The square openings have dimensions of 90×90 $\mu m^2$ and are separated from one another by bars with a width of 35 $\mu m$. The middle portion is surrounded in its entirety by an edge portion without openings and with a width of 0.225 mm. The external diameter of the sample carrier is 3.05 mm and its thickness is approximately 20 $\mu m$. As a result of the openings, the middle portion is partially transparent to electrons, which can pass through the openings but not through the copper bars. The edge portion, which contains no openings, contains a substantial portion of the material of the sample carrier, and thus contributes substantially to the stiffness and strength of the sample carrier, thereby having a strengthening effect.

Such sample carriers are available in other materials, such as gold, nickel and plastic, and also in materials with a coating, such as gilded copper. Such sample carriers are also available with middle portions of another form, e.g. with other dimensions of the openings and/or bars. The thickness of these sample carriers is usually of the order of magnitude of 5 to 50 $\mu m$, and is uniform across the entire sample carrier. The thickness of sample carriers is important in the sense that the middle portion should remain at least partially transparent to electrons when the sample carrier is tilted. Tilting of the sample carrier has, after all, the effect that the electron beam does not impinge perpendicularly on the middle portion of the sample carrier. In the case of the stated dimensions of the openings, and in the case of a thin sample carrier, it will be possible to achieve a larger tilt of the sample carrier—before the transparency becomes unacceptably small—than in the case of a thick sample carrier. For a given maximal tilt and a given dimension of the opening, the maximal thickness of the sample carrier is thus determined. Tilting the sample carrier up to an angle of, for example, 70 degrees is desirable in the case of various types of analysis, such as in the case of tomography for the purpose of a three-dimensional reconstruction of a sample volume.

The user of such a sample carrier will attach a sample to said middle portion of the sample carrier in a manner known per se, and, eventually, will mount the sample carrier with sample on a sample holder of a Transmission Electron Microscope, also referred to as a TEM. Manipulation of the sample carrier usually occurs in this process using pincers. Manipulation of the sample carrier demands much experience, in view of the exceptionally small thickness of the sample carrier. Even for an experienced person, there is a real chance that the sample carrier and/or the sample attached thereto will be deformed or damaged. Greater stiffness and strength of the sample carrier are desired, and can be attained by using a thicker sample carrier; however, this is at odds with the desire to maintain a thin sample carrier for the purpose of analyses in which tilting of the sample carrier is of importance, such as in the case of tomography. In addition, if the pincers touch the middle portion of the sample carrier, the sample mounted thereto can be damaged.

After the sample carrier has been mounted to the sample holder of the TEM, this sample holder can be introduced into the TEM. Once the sample has been introduced, it can be analyzed in a fully automatic manner with the aid of a known program such as "Leginon" from the AMI group of the Scripps Research Institute. Another possibility is that, after the sample has been introduced into the TEM, the TEM is operated via telecommunication—such as via internet—by a user somewhere else, whereby, for example, this user hires analysis time from the administrator of the TEM.

There is a desire to maintain transparency in the middle portion of the sample holder in the case of large tilt angles, so that the sample can be analyzed using, for example, tomography. There is also a desire to realize automatic introduction and removal of sample carriers in a TEM, seeing as this would make it possible to use the TEM continuously without human intervention. In the case of such introduction and removal of sample carriers, there is, in view of the fragile nature of the thin sample carriers, the possibility of deformation of and/or damage to the sample carriers and the samples attached thereto.

SUMMARY OF THE INVENTION

The invention aims to prevent deformation of and damage to sample carriers in the case of manual or automated manipulation, without limiting the ability to use the sample carrier in analyses in which tilting of the sample carrier is of importance.

To this end, the sample carrier according to the invention is characterized in that, throughout at least a portion of the periphery of the middle portion, the edge portion has a thickness that is greater than the thickness of the middle portion.

By making the edge portion of the sample carrier thicker than the middle portion, the strengthening effect of the edge portion increases, and the strength and stiffness of the sample carrier increase. The increase in strength and stiffness is achieved without limiting the ability to use the sample carrier in analyses in which tilting of the sample carrier is of importance, seeing as the thickness of the middle portion—which is of importance for analysis purposes—is not changed. As a result of the increase in strength and stiffness of the sample carrier, the risk of deformation of the sample carrier during manipulation, and damage to the sample attached thereto, is decreased.

An attendant advantage of a thicker edge portion is that it becomes possible to grab hold of the external periphery of the edge portion using manipulation means such as pincers or an automatic introduction mechanism. By having the manipulation means grab hold of the external periphery of the edge portion, said means cannot damage the sample attached to the middle portion of the sample carrier.

By offering several sample carriers—with samples attached thereto—to a robot, this robot can mount the sample carriers to the sample holder of a TEM and introduce them into the TEM for analysis without further human intervention. In this manner, continuous use of the TEM becomes, in principle, possible.

BRIEF DESCRIPTION OF THE DRAWINGS

The invention will be described on the basis of figures, whereby identical reference numerals indicate corresponding elements.

In this respect.

DETAILED DESCRIPTION OF PREFERRED EMBODIMENTS

Figure 1:
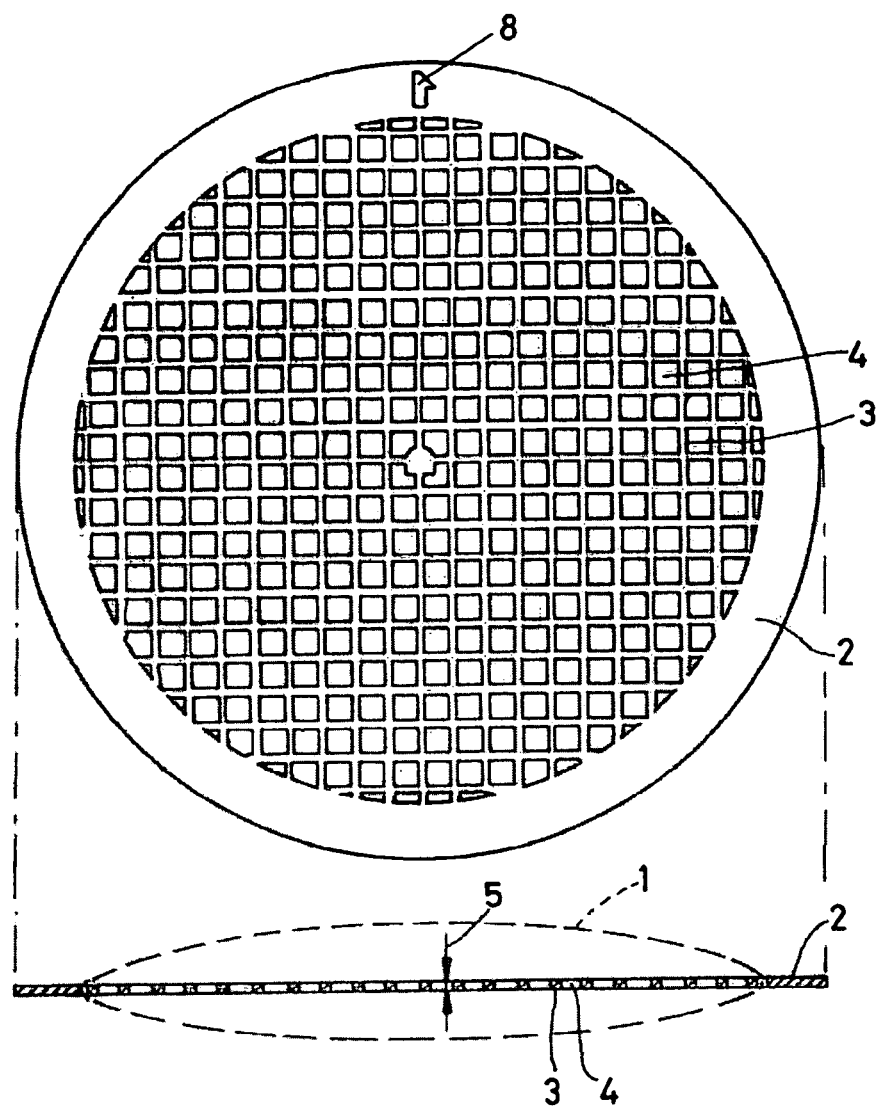
FIG. 1 shows a known sample carrier, in elevation and in cross-section.

FIG. 1 shows a sample carrier as is commonly known from the state of the art. The sample carrier is made of copper, and has a diameter of 3.05 mm. The middle portion 1 consists of openings 4 of size 90×90 μm² and bars 3 with a width of 35 μm. The electrons in an impinging electron beam will be able to pass through the openings 4, but will be blocked by the bars 3. As a result of this geometry, the transparency of the middle portion 1, in the case of a perpendicularly incident electron beam, is approximately 50%.

The middle portion 1 is surrounded by an edge portion 2 with a strengthening effect. The width of the edge portion is 0.225 mm. The edge portion 2 has no openings, with the exception of the orientation mark 8. The thickness 5 of the copper foil is uniform across the entire sample carrier, with a value of approximately 20 μm. A sample can be attached to the middle portion 1 in a manner known per se, whereby the regions of the sample that are of interest during an analysis are located above an opening 4.

It deserves mention that such sample carriers with another form and sizing of the openings 4, other values of the width of the bars 3 and/or another thickness 5 of the foil are known, and that embodiments using materials other than copper are also known.

Figure 2:
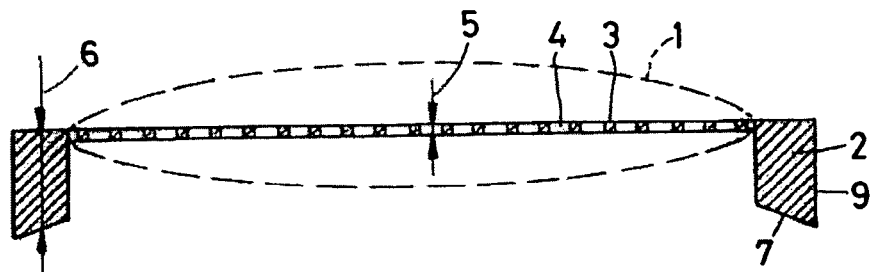
FIG. 2 shows a sample carrier according to the invention, in cross-section.

FIG. 2 shows, in cross-section, a sample carrier according to the invention, whereby the thickness 6 of the edge portion 2 is larger than the thickness 5 of the middle portion 1. As a result hereof, the strengthening effect of the edge portion 2 is greater than the strengthening effect of the edge portion 2 in the case of the known sample carrier. For an optimal strengthening effect, the edge portion 2 will be thicker than the middle portion 1 throughout the entire periphery, i.e. 360 degrees of the periphery. However, for certain applications, it may be desirable to embody only a portion—e.g. 210 degrees—of the edge portion 2 to be thicker than the middle portion 1, whereby the rest of the periphery has an edge portion 2 of thickness equal to that of the middle portion 1. This latter scenario is, for example, of advantage in making the sample, whereby a liquid such as liquid ethane has to be brought into contact with both sides of the sample very rapidly. Although the strengthening effect of an edge portion 2 whereby only part of this edge portion 2 is thickened is less than that of another edge portion 2 that is thickened throughout its periphery, there will be a clear increase in the strengthening effect in both cases.

Moreover, as a result of the greater thickness of the edge portion 2, manipulation means such as pincers can grab hold of the external periphery 9 of the edge portion. The edge portion 2 is provided with a canted side 7 that tapers inwards, as a result of which—in the event that the sample carrier is tilted with respect to an impinging electron beam— an electron beam passing through the central portion, i.e. the direct environment of the center of the middle portion, will not be hindered by this edge portion 2.

The edge portion 2 and/or the middle portion 1 can be provided with some openings or notches for purposes of orientation or manipulation of the sample carrier, without this having a substantial influence on the strengthening effect.

It is also possible that the middle portion 1 and edge portion 2 be made of different materials, whereby the choice of material for the middle portion 1 is determined by the analysis technique to be employed, and the choice of material for the edge portion 2 is determined by the strengthening effect to be achieved in the edge portion 2. In this manner, it is possible to combine a middle portion 1—which, for example, is made of plastic with a carbon coating, as is nowadays used in situations in which the presence of metals in proximity to the sample can lead to faulty analysis—with a metal edge portion 2 that offers a substantially larger strengthening effect than a comparable edge portion 2 of plastic.

What is claimed is:

1. A sample carrier for carrying a sample to be irradiated with an electron beam, which sample carrier comprises a middle portion that is at least partially transparent to electrons, and an edge portion, located at the periphery of the middle portion, with a strengthening effect, characterized in that, throughout at least a portion of the periphery of the middle portion, the edge portion has a thickness that is greater than the thickness of the middle portion.

2. A sample carrier according to claim 1, whereby, throughout at least half of the periphery of the middle portion, the edge portion has a thickness that is greater than the thickness of the middle portion.

3. A sample carrier according to claim 2, whereby the edge portion has a thickness that is at least twice as large as the thickness of the middle portion.

4. A sample carrier according to claim 2, whereby the edge portion has a thickness that is at least ten times as large as the thickness of the middle portion.

5. A sample carrier according to claim 2, whereby the edge portion is formed in such a manner that an electron beam passing through the central portion, with an angle of incidence of the electron beam of ±70 degrees with respect to the normal to the middle portion, will not be hindered by the edge portion.

6. A sample carrier according to claim 5, whereby the edge portion has a thickness that is at least twice as large as the thickness of the middle portion.

7. A sample carrier according to claim 5, whereby the edge portion has a thickness that is at least ten times as large as the thickness of the middle portion.

8. A sample carrier according to claim 1, whereby, throughout the entire periphery of the middle portion, the edge portion has a thickness that is greater than the thickness of the middle portion.

9. A sample carrier according to claim 8, whereby the edge portion has a thickness that is at least ten times as large as the thickness of the middle portion.

10. A sample carrier according to claim 8, whereby the edge portion has a thickness that is at least twice as large as the thickness of the middle portion.

11. A sample carrier according to claim 8, whereby the edge portion is formed in such a manner that an electron beam passing through the central portion, with an angle of incidence of the electron beam of ±70 degrees with respect to the normal to the middle portion, will not be hindered by the edge portion.

12. A sample carrier according to claim 11, whereby the edge portion has a thickness that is at least twice as large as the thickness of the middle portion.

13. A sample carrier according to claim 11, whereby the edge portion has a thickness that is at least ten times as large as the thickness of the middle portion.

14. A sample carrier according to claim 1, whereby the edge portion is formed in such a manner that an electron beam passing through the central portion, with an angle of incidence of the electron beam of ±70 degrees with respect to the normal to the middle portion, will not be hindered by the edge portion.

15. A sample carrier according to claim 14, whereby the edge portion has a thickness that is at least twice as large as the thickness of the middle portion.

16. A sample carrier according to claim 14, whereby the edge portion has a thickness that is at least ten times as large as the thickness of the middle portion.

17. A sample carrier according to claim 1, whereby the edge portion has a thickness that is at least twice as large as the thickness of the middle portion.

18. A sample carrier according to claim 1, whereby the edge portion has a thickness that is at least ten times as large as the thickness of the middle portion.

19. A sample carrier for carrying a sample to be irradiated with an electron beam, which sample carrier comprises a middle portion that is at least partially transparent to electrons, and an edge portion, located at the periphry of the middle portion, with a strengthening effect, the sample carrier adapted for mounting into a sample holder of an electron microscope, characterized in that, throughout at least a portion of the periphery of the middle portion, the edge portion has a thickness that is greater than the thickness of the middle portion.

20. A sample carrier according to claim 19, in which the sample carrier is adapted to be mounted into a sample holder of a transmission electron microscope.

\* \* \* \* \*